(12) United States Patent
Paquet et al.

(10) Patent No.: US 10,591,694 B2
(45) Date of Patent: Mar. 17, 2020

(54) PHOTONIC CHIP HAVING A MONOLITHICALLY INTEGRATED REFLECTOR UNIT AND METHOD OF MANUFACTURING A REFLECTOR UNIT

(71) Applicant: INSTITUT NATIONAL D'OPTIQUE, Québec (CA)

(72) Inventors: Alex Paquet, Québec (CA); Francois Baribeau, Quebec (CA)

(73) Assignee: INSTITUT NATIONAL D'OPTIQUE, Québec (CA)

( * ) Notice: Subject to any disclaimer, the term of this patent is extended or adjusted under 35 U.S.C. 154(b) by 145 days.

(21) Appl. No.: 15/896,838

(22) Filed: Feb. 14, 2018

(65) Prior Publication Data
US 2018/0231732 A1  Aug. 16, 2018

Related U.S. Application Data

(60) Provisional application No. 62/458,706, filed on Feb. 14, 2017.

(51) Int. Cl.
*G02B 6/46* (2006.01)
*H01S 5/183* (2006.01)
(Continued)

(52) U.S. Cl.
CPC ........... *G02B 6/46* (2013.01); *G02B 6/12004* (2013.01); *G02B 6/124* (2013.01); *G02B 6/305* (2013.01);
(Continued)

(58) Field of Classification Search
CPC .................... G02B 6/4214; G02B 2006/12104
See application file for complete search history.

(56) References Cited

U.S. PATENT DOCUMENTS 7,162,124 B1    1/2007  Gunn, III et al.
2004/0042212 A1*  3/2004  Du ........................... F21S 8/02
                                                      362/296.04
(Continued)

FOREIGN PATENT DOCUMENTS

WO    2012031781 A2    3/2012
WO    2015176050 A1    11/2015
WO    2016011002 A1    2/2016

OTHER PUBLICATIONS

Song et al. "3D integrated hybrid silicon laser" 2016. vol. 24, No. 10. Optics Express.
(Continued)

*Primary Examiner* — Thanh Luu
(74) *Attorney, Agent, or Firm* — Reno Lessard; Norton Rose Fulbright Canada LLP

(57) ABSTRACT

There is described a method of manufacturing a reflector unit on a photonic chip. The method generally has a step of providing a substrate having a top surface with a region of interest, the region of interest being covered with a bulge of a removable material; monolithically integrating a layer of metallic material over a portion of the top surface adjacent to the bulge and over a portion of the bulge, the layer of metallic material forming a base monolithically integrated to the top surface and a pocket monolithically integrated over the bulge in a manner leaving a portion of the bulge uncovered; and removing the bulge of the removable material to form a reflector unit for reflecting light incoming from the region of interest or towards the region of interest.

16 Claims, 14 Drawing Sheets

(51) Int. Cl.
  *H01S 5/026*    (2006.01)
  *G02B 6/12*     (2006.01)
  *G02B 6/30*     (2006.01)
  *G02B 6/124*    (2006.01)
  *H01S 5/14*     (2006.01)
  *H01S 5/10*     (2006.01)

(52) U.S. Cl.
  CPC ........ *H01S 5/0262* (2013.01); *H01S 5/18361* (2013.01); *H01S 5/1032* (2013.01); *H01S 5/141* (2013.01)

(56) References Cited

U.S. PATENT DOCUMENTS

2015/0355420 A1   12/2015   Li et al.
2017/0092309 A1*   3/2017   Goulakov ............ G11B 5/3133

OTHER PUBLICATIONS

Schrauwen et al. "Polymer wedge for perfectly vertical light coupling to silicon" 2009. Integrated Optics: Devices, Materials, and Technologies XIII. Proc. of SPIE vol. 7218 72180B-1.
Zhang et al. "Ultra-short distributed Bragg reflector fiber laser for sensing applications" 2009. vol. 17, No. 12. Optics Express.
Picard et al. "MEMS-Based Light Valves for Ultra-High Resolution Projection Displays" 2002. Toronto.

* cited by examiner

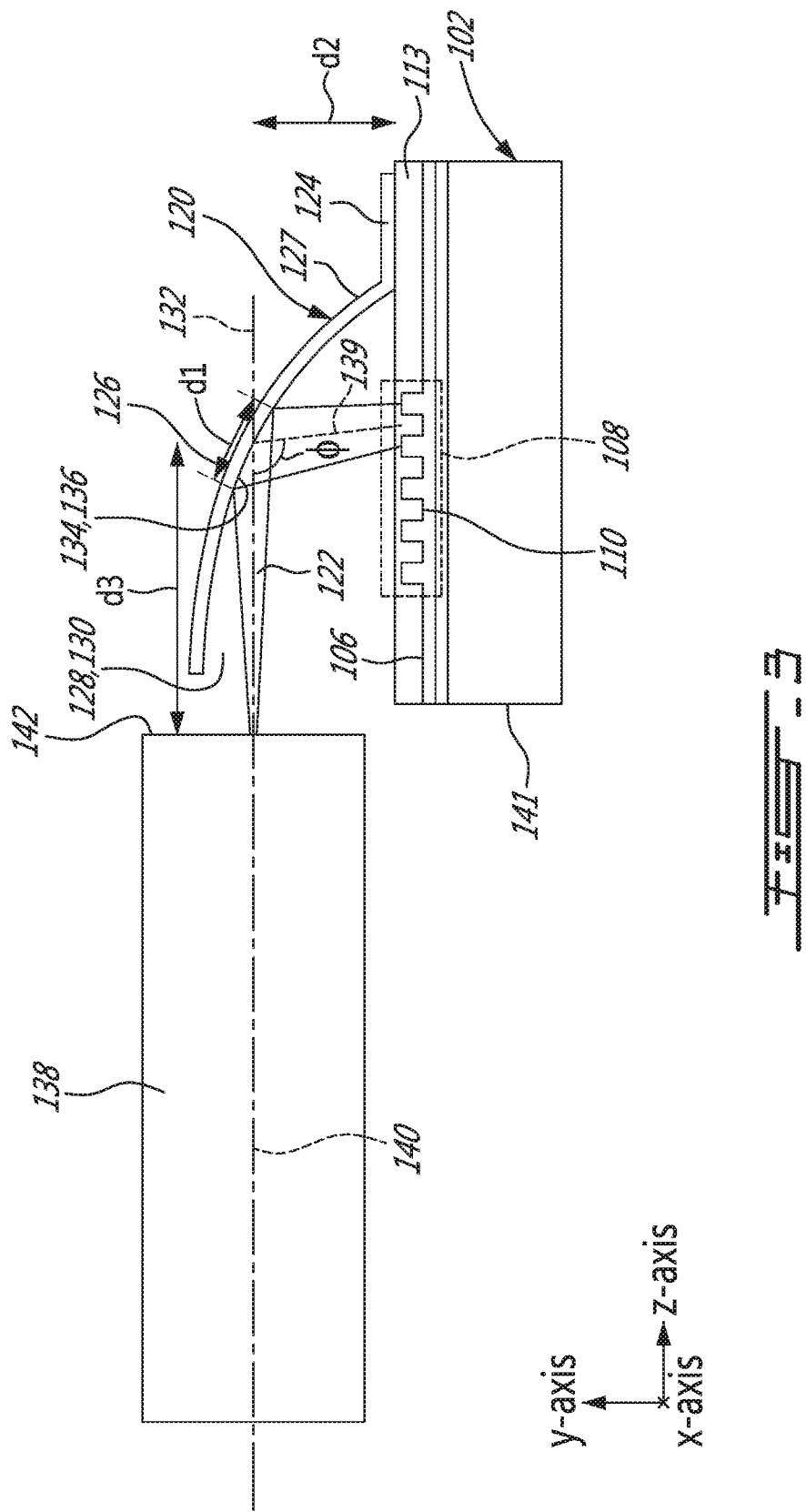

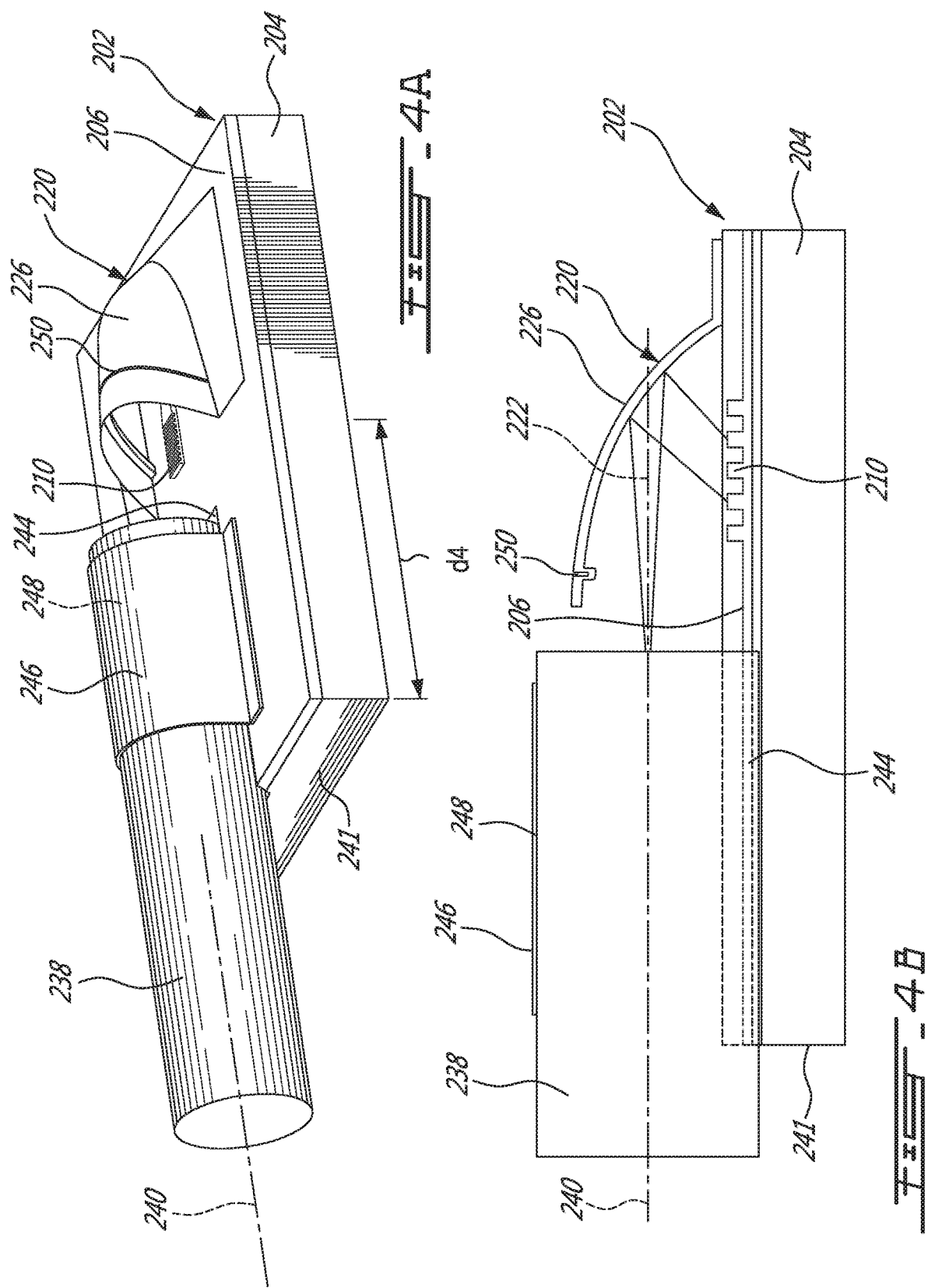

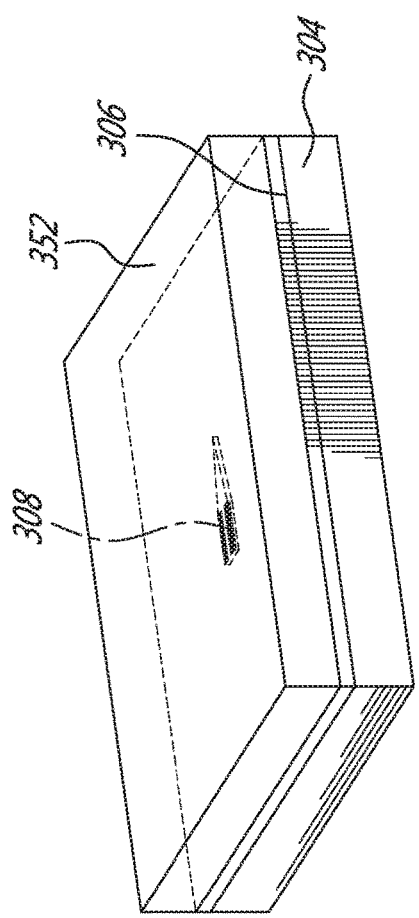
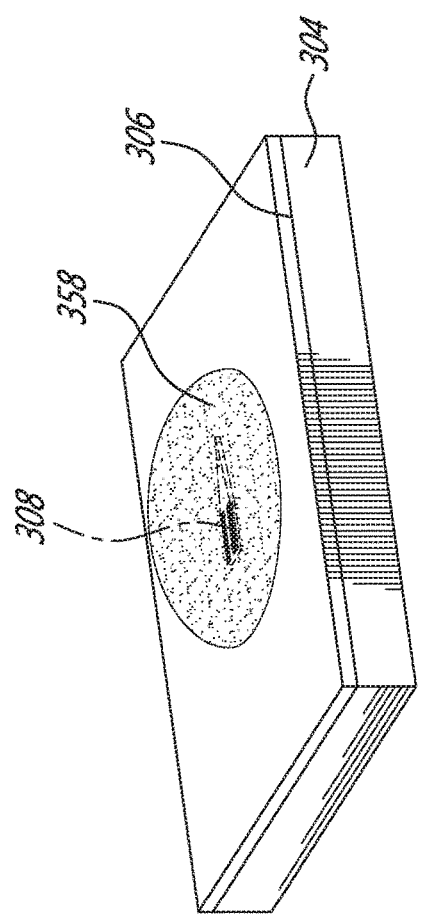
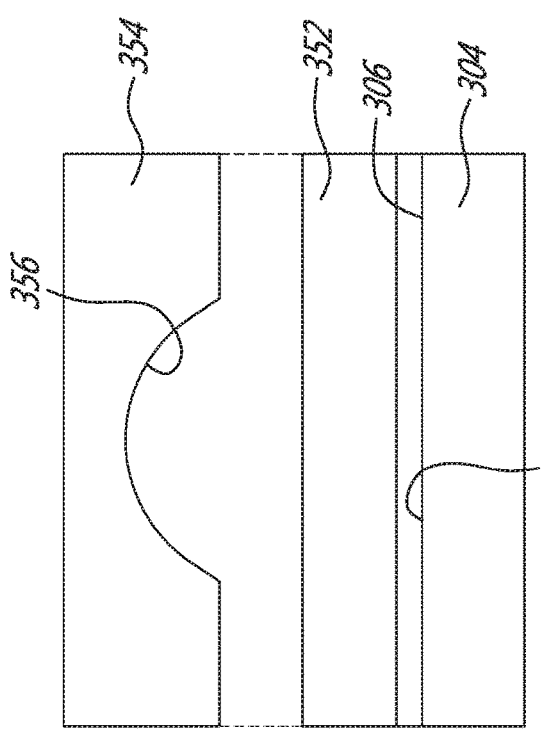
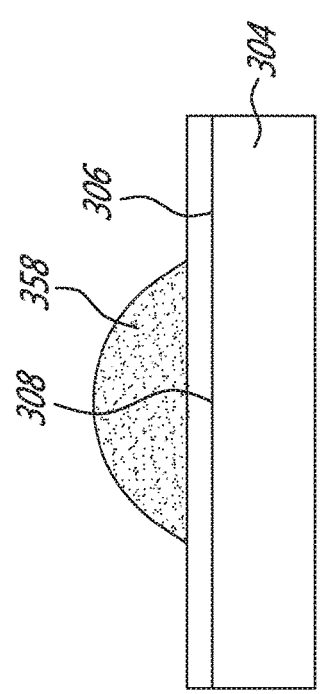

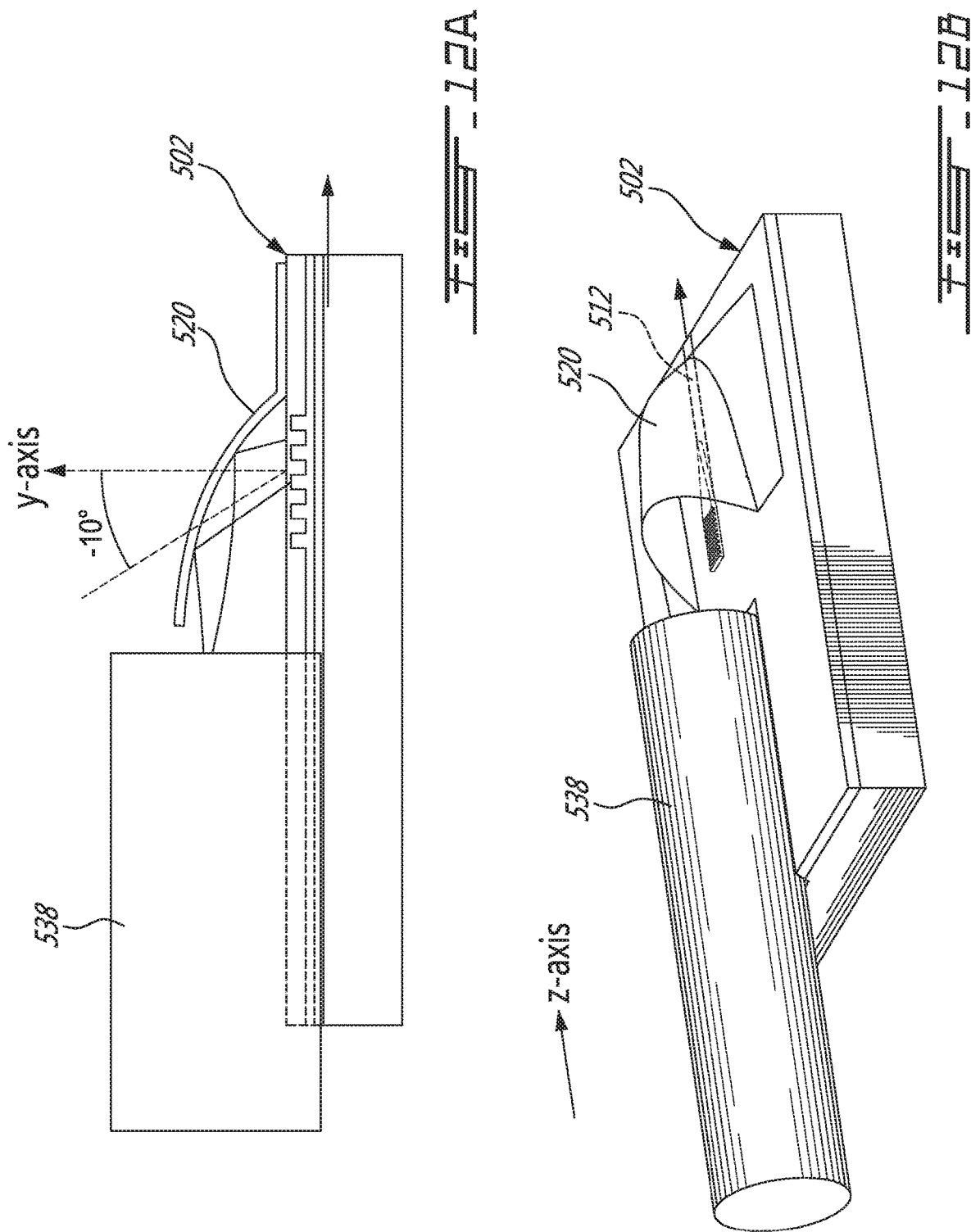

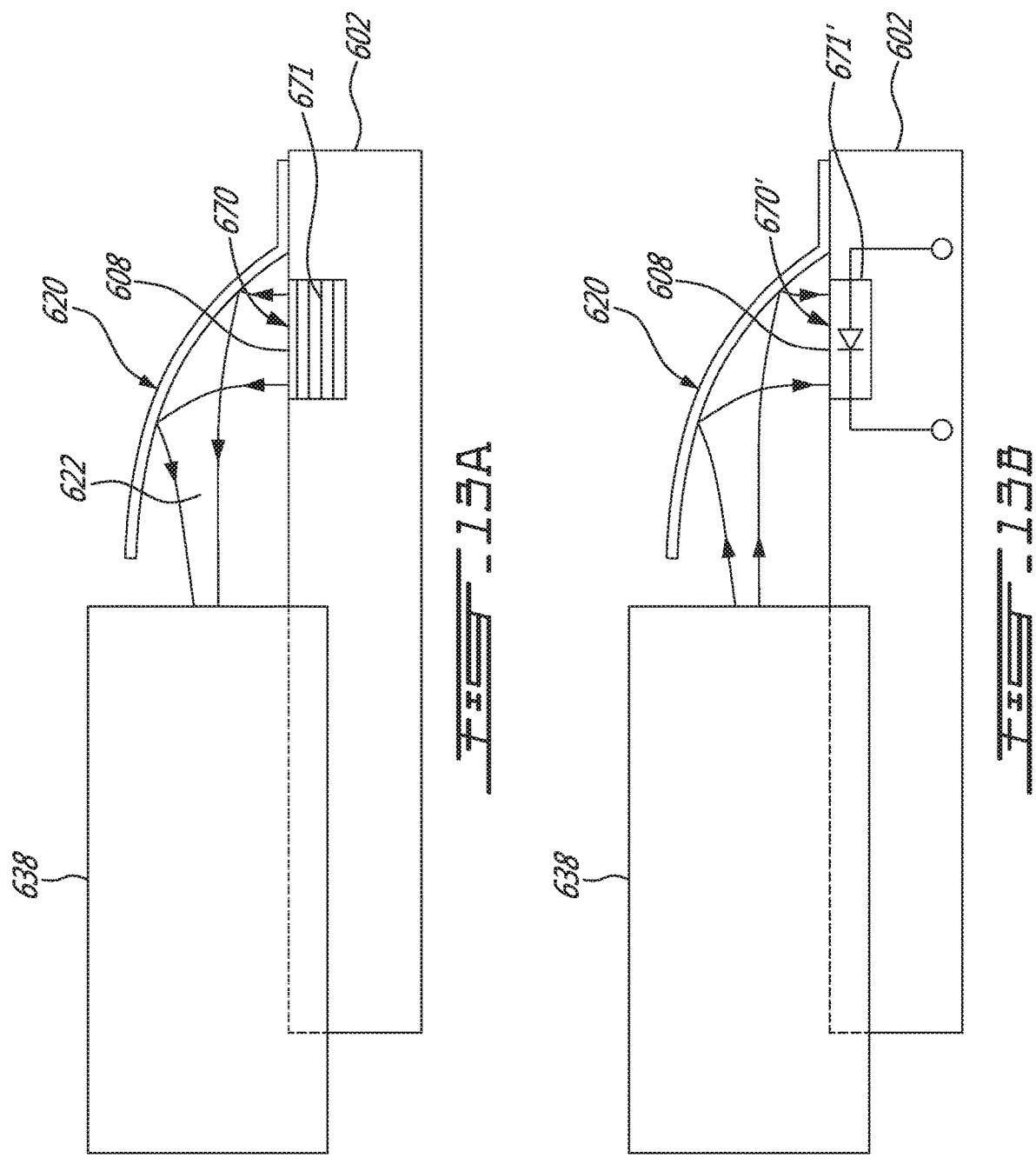

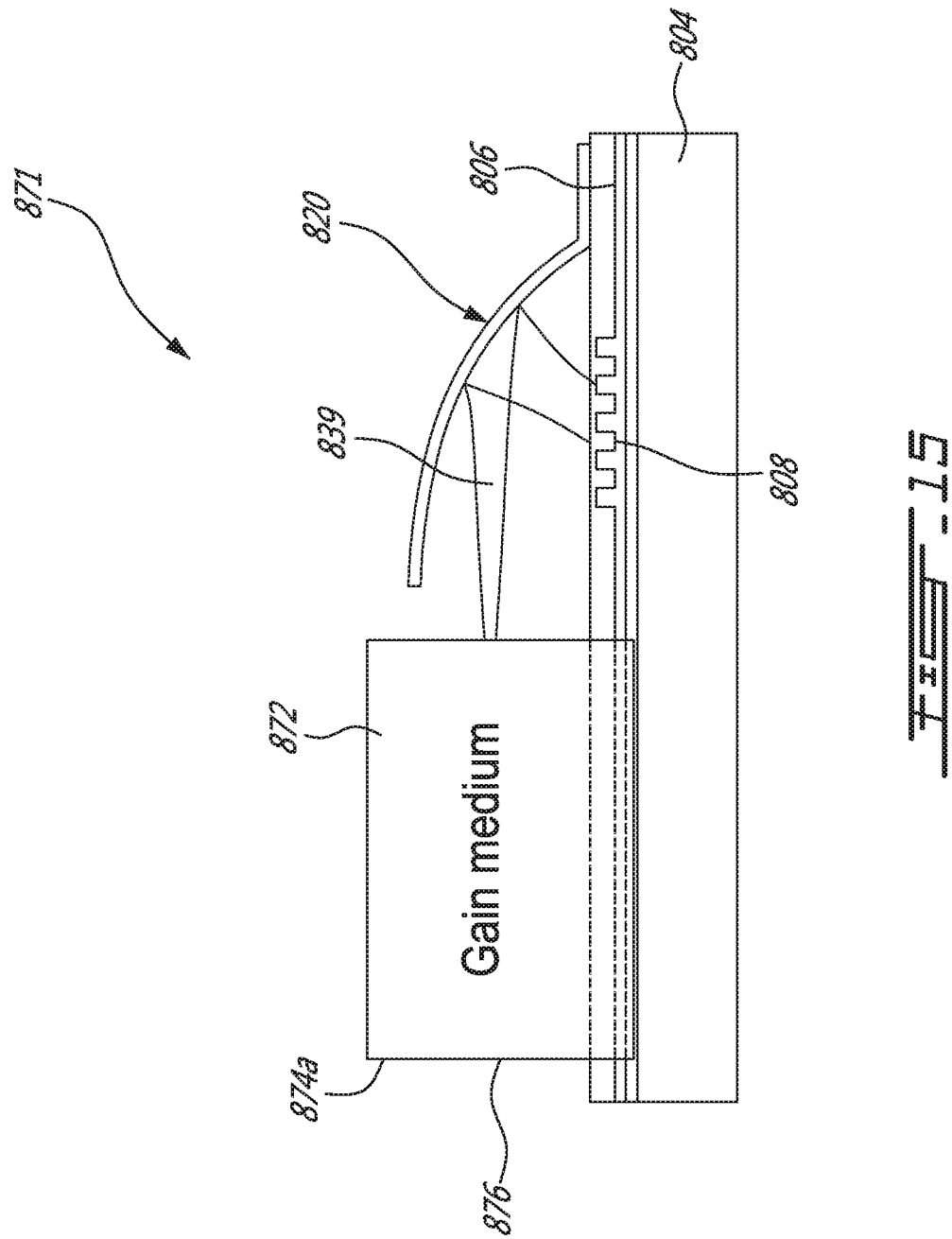

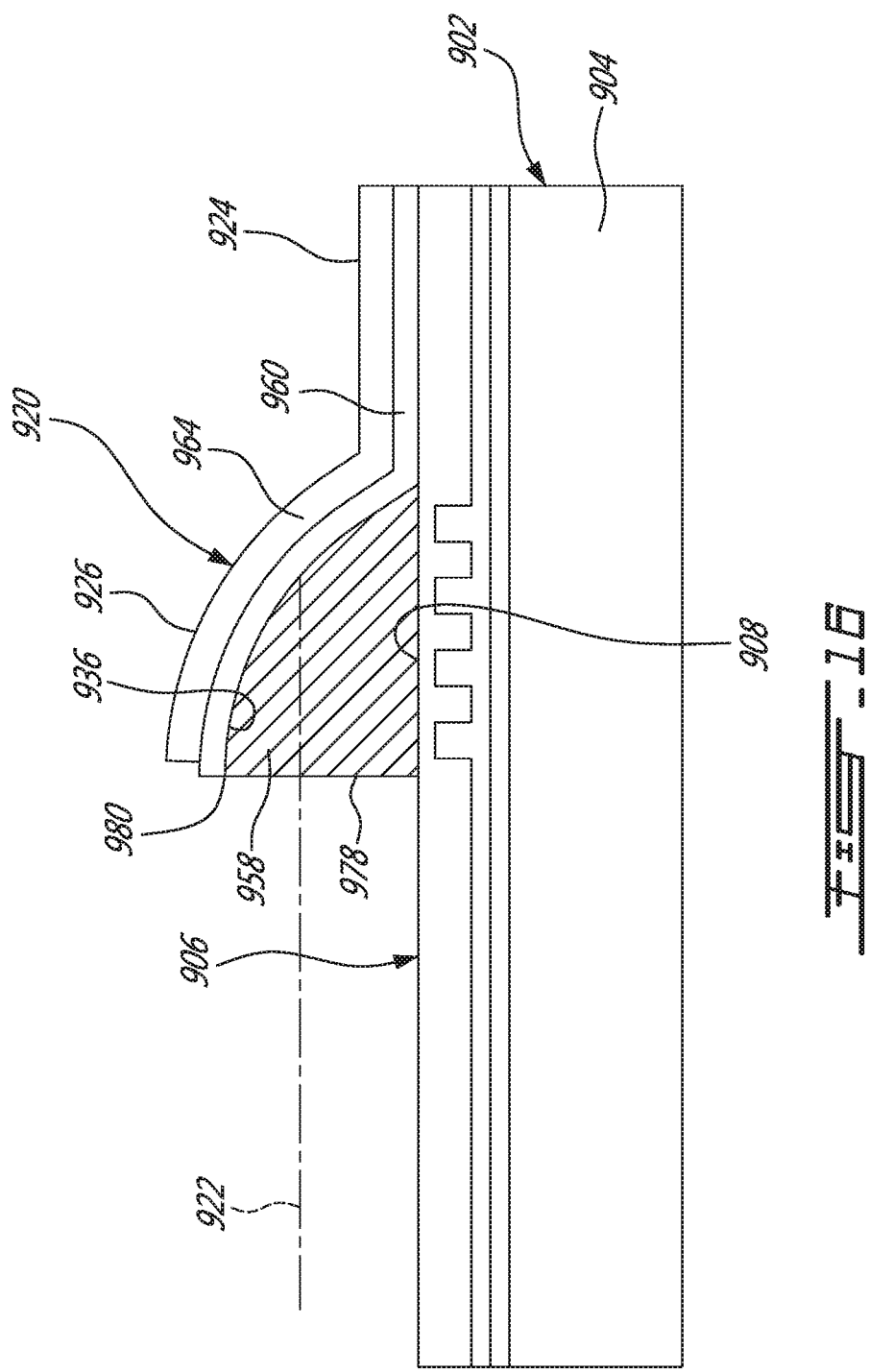

PHOTONIC CHIP HAVING A MONOLITHICALLY INTEGRATED REFLECTOR UNIT AND METHOD OF MANUFACTURING A REFLECTOR UNIT

FIELD

The improvements generally relate to the field of coupling light into or from an optical waveguide, and more particularly to the field of coupling light into or from an optical waveguide fixedly mounted relative to a photonic chip.

BACKGROUND

The development of smaller circuits having improved specifications has been investigated to a certain extent. In some applications, it is found useful to use photonic chips, i.e. devices which involve the use of light directly on a chip in a manner analogous to the use of electricity in electronic chips.

These photonic chips are generally configured to propagate and process light from a photonic device to another via optical waveguides present on the photonic chip, conveniently referred to as chip waveguides. Typically, the incoming light is received from an external optical waveguide such as an optical fiber via direct coupling into one of the chip waveguides. Such direct coupling of the incoming light into the chip waveguides of the photonic chip can be challenging since these chip waveguides typically have cross-sectional areas much smaller than that of the external optical waveguide.

Vertical grating couplers can sometimes be used in vertical coupling configurations to increase the coupling efficiency between the external optical waveguide and a chip waveguide of the photonic chip. FIG. 1 shows an example of a vertical grating coupler 10 disposed on a photonic chip 12 and coupled to a chip waveguide 16 via a tapered waveguide 18. The vertical grating coupler 10 is specifically designed to receive light 20 emitted from an external optical waveguide 22 at an angle θ (e.g., smaller than 20°) close to normal incidence. As best seen in FIG. 1A, when using the vertical grating coupler 10, the resulting photonic chip 12 is rather bulky because the external optical waveguide 22 has to be maintained upright and tilted relative to the photonic chip 12 for efficient coupling.

Although existing coupling techniques have been found to be satisfactory up to a certain extent, there remains room for improvement.

SUMMARY

In one aspect, there is described a photonic chip having a reflector unit which is monolithically integrated onto a top surface of the photonic chip. In this aspect, the reflector unit is configured to receive light parallel to the top surface and to reflect the received light towards a region of interest of the top surface, or vice versa. The reflector unit is monolithically integrated to the top surface of the photonic chip using surface micromachining techniques, which allows the reflector unit to be precisely positioned relative to the region of interest. In some embodiments, the light is received from an external optical waveguide such as an optical fiber which is passively or actively aligned with respect to the reflector unit. One purpose of the reflector unit is to provide a low-profile approach to the photonic chip, which can eventually better fit in relatively small packages and reduce its footprint. Another purpose of such reflector unit is to relax the tolerances of the positioning process of the external optical waveguide with respect to the region of interest of the photonic chip.

In another aspect, there is described a method of manufacturing the reflector unit on a photonic chip using surface micromachining techniques. In this aspect, a bulge having a predetermined size and shape and being made of a removable material is provided onto the region of interest. Then, a layer of metallic material is monolithically integrated onto a portion of the bulge and onto a portion of the top surface adjacent to the bulge. The removable material is removed from the photonic chip, so as to leave a base monolithically integrated to the top surface of the photonic chip and a pocket which extends upwardly from the base and towards the region of interest. The inner face of the pocket, being formed of metallic material, acts as a reflective surface for receiving light parallel to the top surface and to reflect the received light towards a region of interest of the top surface, or vice versa.

In accordance with one aspect, there is provided a method of manufacturing a reflector unit on a photonic chip, the method comprising: providing a substrate having a top surface with a region of interest, the region of interest being covered with a bulge of a removable material; monolithically integrating a layer of reflective material over a portion of the top surface adjacent to the bulge and over a portion of the bulge, the layer of reflective material forming a base monolithically integrated to the portion of the top surface and a pocket monolithically integrated over the portion of the bulge in a manner leaving a portion of the bulge uncovered; and removing the bulge of the removable material, the pocket having a lateral opening leaving a cavity between the pocket and the region of interest, the cavity receiving an optical axis extending parallel to the top surface, spaced apart from the top surface and through the opening, the layer of reflective material forming a reflector unit for reflecting light at least one of incoming from the region of interest and towards the region of interest.

In accordance with another aspect, there is provided a method of manufacturing a reflector unit on a photonic chip, the method comprising: providing a substrate having a top surface with a region of interest, the region of interest being covered with a bulge of a removable material; monolithically integrating a layer of reflective material over a portion of the top surface adjacent to the bulge and over a portion of the bulge, the layer of reflective material forming a base monolithically integrated to the portion of the top surface and a pocket monolithically integrated over the portion of the bulge in a manner leaving a portion of the bulge uncovered; and removing the bulge of the removable material, the pocket having a lateral opening leaving a cavity between the pocket and the region of interest, the cavity receiving an optical axis extending parallel to the top surface, spaced apart from the top surface and through the opening, the layer of reflective material forming a reflector unit for reflecting light at least one of incoming from the region of interest and towards the region of interest.

In accordance with another aspect, there is provided a photonic chip comprising: a substrate having a top surface with a region of interest, a reflector monolithic to the substrate and having a reflective surface extending above the top surface and facing the top surface, the reflective surface forming an elbow to an optical path extending between the region of interest and a propagation axis of an external optical waveguide (e.g., an optical fiber) parallel to the substrate.

In another aspect, there is described a method of manufacturing the reflector unit on a photonic chip using surface micromachining techniques. In this aspect, a bulge having a predetermined size and shape and being made of an optically transparent material is provided onto the region of interest. Then, a layer of metallic material is monolithically integrated onto a portion of the bulge and onto a portion of the top surface adjacent to the bulge. This leaves a base monolithically integrated to the top surface of the photonic chip and a pocket which extends upwardly from the base, over the bulge of optically transparent material and towards the region of interest. The inner face of the pocket, being formed of metallic material, acts as a reflective surface for receiving light parallel to the top surface and to reflect the received light towards a region of interest of the top surface, or vice versa.

In some embodiments, the region of interest includes a vertical grating coupler such that light can be coupled from an external optical waveguide to the vertical grating coupler via the reflector unit, or vice versa. In some other embodiments, the region of interest includes a light source such as a vertical cavity surface-emitting laser (VCSEL) in a manner that light emitted from the VCSEL can be coupled to the external optical waveguide via the reflector unit. However, in alternate embodiments, other types of embedded or deposited light source can also be used. Moreover, in further embodiments, the region of interest includes a light detector such as a photodiode in a manner that light received by the reflector unit be reflected towards the light detector.

In this disclosure, the word "parallel" is meant to be construed broadly so as to encompass situations where the optical axis and the top surface of the photonic chip are substantially parallel to one another.

Many further features and combinations thereof concerning the present improvements will appear to those skilled in the art following a reading of the instant disclosure.

DESCRIPTION OF THE FIGURES

In the figures,

FIG. 3 is a sectional side view of the photonic chip of FIG. 2, showing an external optical waveguide being optically coupled with the region of interest via an active alignment technique, in accordance with an embodiment;

FIG. 4A is an oblique view of an example of a photonic chip with a monolithically integrated reflector unit, showing an external optical waveguide being optically coupled to a region of interest via a passive alignment technique, in accordance with an embodiment;

FIG. 4B is a sectional side view of the photonic chip of FIG. 4A, in accordance with an embodiment;

FIG. 5A is a sectional view of an example of a photonic chip in a first step of a method of manufacturing a reflector unit on a photonic chip, in accordance with an embodiment;

FIG. 5B is an oblique view of the photonic chip of FIG. 5A, in accordance with an embodiment;

FIG. 6A is a sectional view of an example of a photonic chip in a second step of a method of manufacturing a reflector unit on a photonic chip, in accordance with an embodiment;

FIG. 6B is an oblique view of the photonic chip of FIG. 6A, in accordance with an embodiment;

FIG. 12A is a sectional view of an example of a photonic chip having a reflector unit reflecting light at another, second angle relative to a normal axis of the photonic chip, in accordance with an embodiment;

FIG. 12B is an oblique view of the photonic chip of FIG. 12A;

FIG. 13A is a sectional view of an example of a photonic chip with a monolithically integrated reflector unit extending over a region of interest including a light source, in accordance with an embodiment;

FIG. 13B is a sectional view of an example of a photonic chip with a monolithically integrated reflector unit extending over a region of interest including a light detector, in accordance with an embodiment;

FIG. 15 is a sectional view of an example of a photonic chip having a piece of laser-active material adjacent to a monolithically integrated reflector unit, in accordance with an embodiment; and FIG. 16 is a sectional view of an example of a photonic chip having a monolithically integrated reflector unit and a bulge of optically transparent material in a cavity of the reflector unit, in accordance with an embodiment.

DETAILED DESCRIPTION

Figure 1A:
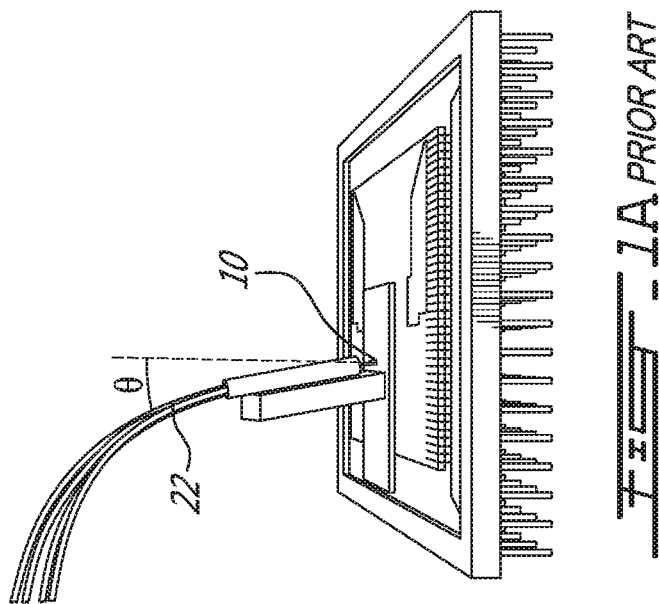
FIG. 1A is an oblique view of an example of a photonic chip having optical fibers coupled thereto via corresponding vertical grating couplers, in accordance with the prior art.
Figure 1:
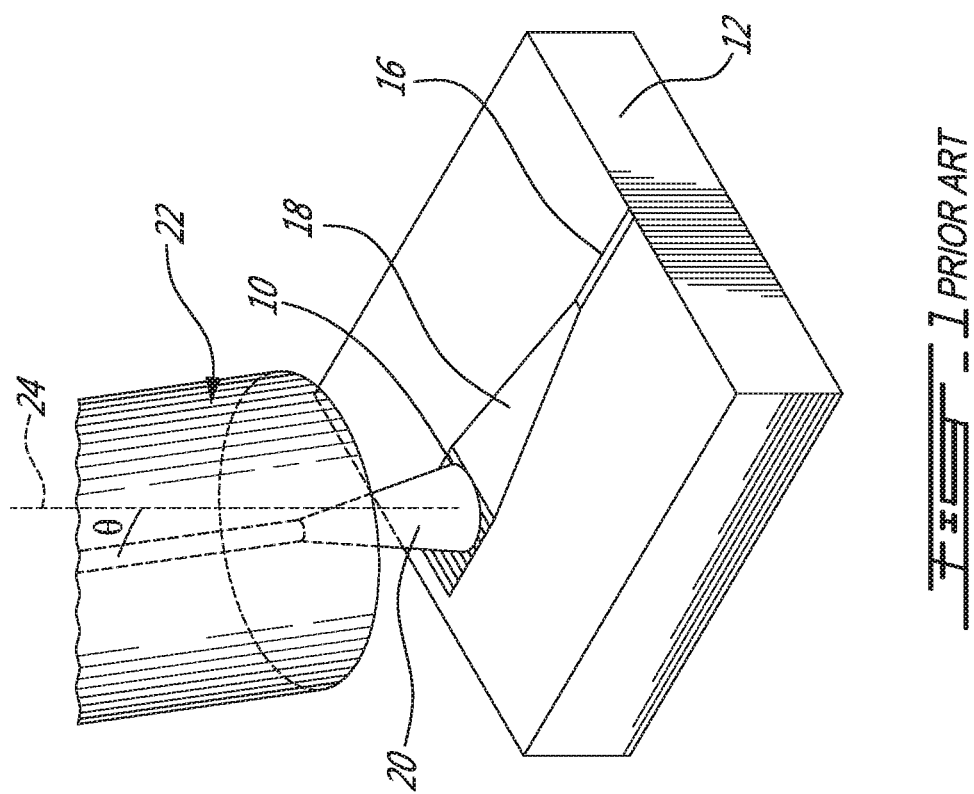
FIG. 1 is an oblique view of an example of a photonic chip with a vertical grating coupler, in accordance with the prior art.
Figure 2:
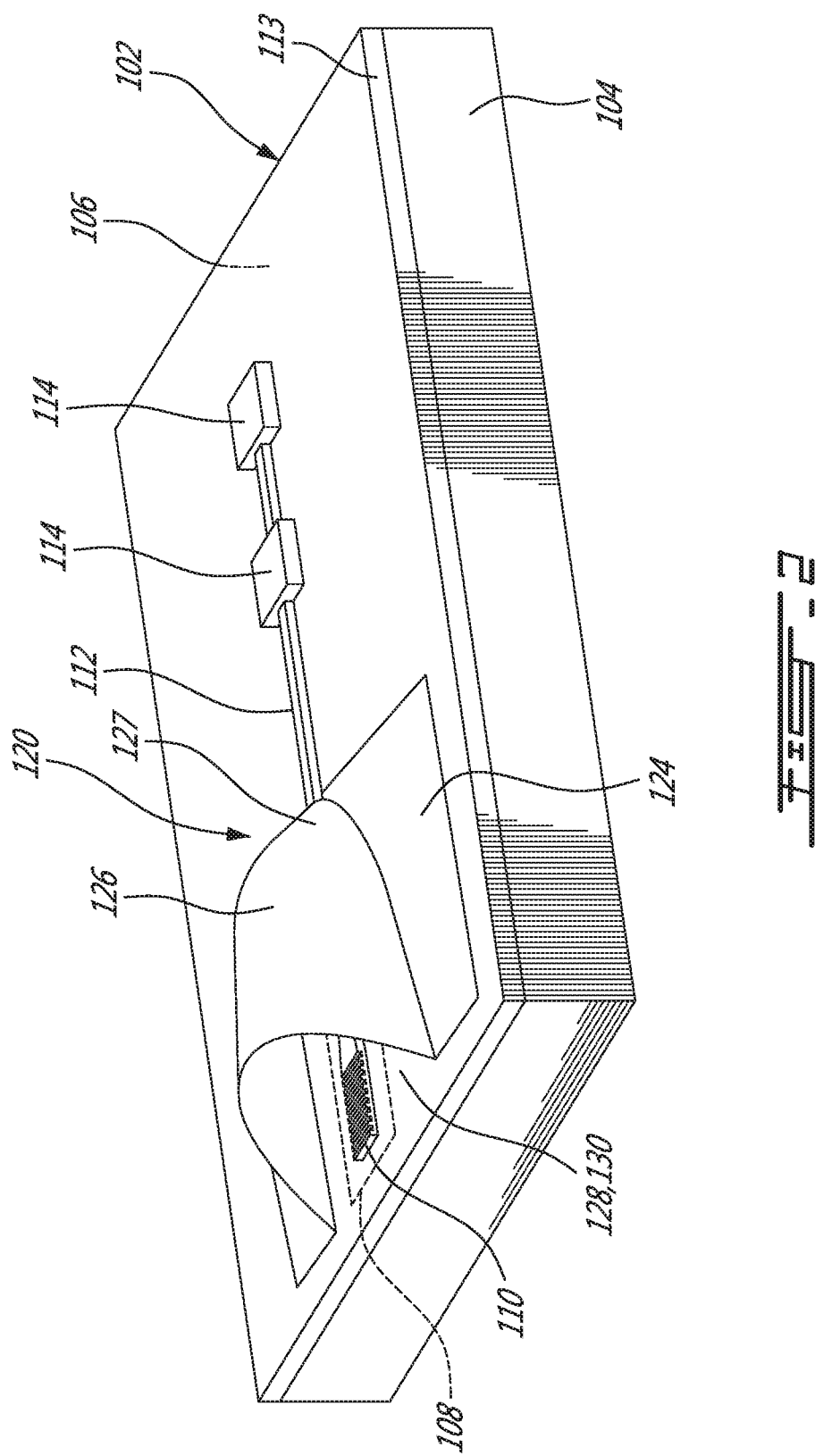
FIG. 2 is an oblique view of an example of a photonic chip with a monolithically integrated reflector unit extending over a region of interest including a vertical grating coupler, in accordance with an embodiment.

FIG. 2 shows an example of a photonic chip 102, in accordance with an embodiment. The photonic chip 102 typically has a substrate 104 with a top surface 106 on which is disposed, in a region of interest 108, a vertical grating coupler 110 optically coupled to a chip waveguide 112. In the illustrated embodiment, the top surface 106, the region of interest 108 and the vertical grating coupler 110 are covered by a cladding layer 113. In this example, the vertical grating coupler 110 is used to enhance coupling of the light into the chip waveguide 112 while the latter delivers the received light to one or more photonic devices 114. The photonic devices 114 can be adapted to perform various optical functions including amplifying, multiplexing, demultiplexing, switching, propagating, amplitude/phase modulating, splitting, filtering, optical pumping and detecting, according to the intended use of the associated photonic chip 102.

Broadly described, and referring now to FIG. 3, the photonic chip 102 has a reflector unit 120 monolithically integrated thereto for receiving light 122 that propagates parallel to the top surface 106 of the photonic chip 102 and for reflecting the received light 122 towards the region of interest 108, and more specifically towards the vertical grating coupler 110, or vice versa. In the illustrated embodiment, the light 122 is provided in the form of a light beam which may be referred to as light beam 122.

Referring back to FIG. 2, the reflector unit 120 has a base 124 which is monolithically integrated to the top surface 106 of the substrate 104 and a pocket 126 which extends upwardly from the base 124 and which has a lateral opening 128 leading to a cavity 130 between the pocket 126 and the region of interest 108. In this specific embodiment, the pocket extends above the region of interest 108. As best seen in FIG. 3, an optical axis 132 extends parallel to the top surface 106, spaced apart from the top surface 106, and through the opening.

More specifically, in this embodiment, the base 124 is monolithically integrated to the top surface 106 via the cladding layer 113. In such embodiments, the base 124 of the reflector unit 120 does not adversely affect the functioning of the photonic chip 102, e.g., it does not affect the propagation of the light in the chip waveguide 112. However, the cladding layer 113 can be omitted in some other embodiments, in which case the base 124 can be monolithically integrated directly to the top surface 106. In this case, the reflector unit is adapted to reduce its impact on the operation of the photonic chip 102. In this way, a reflective surface 134 is provided on an inner face 136 of the pocket 126 for reflecting the light 122 towards the region of interest 108. In some embodiments, the base 124 and the pocket 126 include a monolithic layer 127 of a reflective material shaped in the form of the reflector unit 120. In these embodiments, the monolithic layer 127 is a monolithic layer of a metallic reflective material such as aluminum or silver.

As depicted in the example of FIG. 3, the light 122 is received from an external optical waveguide 138 such as an optical fiber. In this embodiment, the reflective surface 134 forms an elbow φ to an optical path 139 extending between a propagation axis 140 of the external optical waveguide 138 and the region of interest 108. In this embodiment, the external optical waveguide 138 can be approached with a high precision multi-axis and multi angle positioning system which can align the propagation axis inside the reflector unit 120 so that light coupling into the vertical grating coupler 110 and thus in the chip waveguide 112 can be maximised. Once aligned, the external optical waveguide 138 can be held in place by means of glue, welding or other attachment techniques. Such active alignment can help reduce optical coupling losses between the external optical waveguide 138 and the vertical grating coupler 110. In such active alignment technique, it can be advantageous to position the reflector unit 120 close to an edge 141 of the photonic chip 102. As it will be described in more details below, passive alignment techniques can be used in place of or in addition to active alignment.

An optimum coupling efficiency of the vertical grating coupler 110 can be achieved when the light 122 has a specific orientation and position relative to the vertical grating coupler 110. Typical vertical grating coupler designs present excess loss in the order of 3 dB for an in-plane displacement of 4 µm of the received light 122 on the top surface 106. Such stringent position accuracies can be difficult to obtain without precise motorized alignment equipment.

To reduce post-process misalignment, the number of attaching interfaces and the number of constituting elements of the photonic device 114 must be minimized. Moreover, the manufacturing tolerances of each element and manufacturing method are all added. Thus, it can be challenging to achieve an accurate alignment. With conventional microfabrication processes, the tolerances of the reflector unit 120 can be controlled with satisfactory accuracy and precision. For instance, the position of the reflector unit 120 relative to the vertical grating coupler 110 can be as accurate as <100 nm in some embodiments.

As an input optical element, the reflector unit 120 reflects the light 122 incoming from the external optical waveguide 138 and directs it (focuses it if needed) on the vertical grating coupler 110 at the design incidence angle. As an output optical element, the reflector unit 120 reshapes the light emitted from the vertical grating coupler 110 to produce a mode field that matches the one of the external optical waveguide 138 and reflects the emitted light 122 towards it.

It can thus be advantageous to optimize the shape of the reflective surface 134 to relax alignment tolerances of the external optical waveguide 138, to compensate for other tolerances of the photonic chip 102. For instance, the reflective surface 134 can have an ellipsoidal shape, an off-axis parabolic shape, an aspheric shape, a customized shape, a freeform surface design and the like.

Still referring to the example of FIG. 3, the inner face 136 is concave so that the reflective surface 134 can act as a concave mirror for suitably focusing the light 122 onto the vertical grating coupler 110. More specifically, the reflective surface 134 has an ellipsoidal shape. In a computer simulation, it was found that the optical irradiance distribution at the endface or tip 142 of the external optical waveguide 138 can be imaged on the vertical grating coupler 110 with a 1:1 ratio when the external optical waveguide 138 is a singlemode optical fiber having a mode field diameter of 10 µm, the reflective surface 134 has an effective area of diameter d1 of about 38 µm, an angle of 13.45° from a normal axis of the vertical grating coupler 110, a spacing distance d2 of 40 µm and a distance d3 of 100 µm between the tip 142 of the external optical waveguide 138 and the effective area of the reflective surface 134, and a first radius of curvature of 44 µm along the x-axis and a second radius of curvature of 73 µm along the y-axis. In this specific embodiment, the ellipsoidal shape is designed to limit unwanted aberrations. These dimensions are provided as examples only, other dimensions can also be used in other embodiments.

The size, shape and position of the reflective surface 134 can vary so as to adjust the optical characteristics of the light 122 reflected towards the region of interest 108. Examples of such optical characteristics include the mode field diameter of the light 122 and the wavefront of the light 122 in a plane of the region of interest 108, and the incidence angle φ relative to the top surface 106 of the photonic chip 102.

In some embodiments, the shape of the reflective surface 134 can have an off-axis paraboloid shape which can allow to focus collimated light to a focal point on the vertical grating coupler 110 at a predetermined incidence angle ϕ.

For instance, in some other embodiments, the reflective surface is a planar mirror forming a 45° angle with the top surface of the photonic chip. It is well-known that the reflection on the planar mirror would not change the size of the light beam 122. Due to the divergence of the light beam 122 exiting from the external optical waveguide, the light beam 122 can have a larger mode field at the region of interest than upstream. Although the planar mirror can be easier to manufacture, it does not allow for adjusting the optical characteristics of the reflected light. In these embodiments, the vertical grating coupler can be optimized accordingly for reaching satisfactory coupling efficiencies. Additionally, or alternatively, an additional optical element such as a gradient index (GRIN) fiber can be inserted in the light path to adjust the optical characteristics of the light beam 122.

It is noted that the vertical grating coupler 110 can be any suitable type of vertical grating coupler depending on the embodiment. For instance, in some embodiments, the vertical grating coupler is a focusing grating coupler. However, in some other embodiments, the vertical grating coupler is a polarization splitting grating coupler. In these embodiments, the external optical waveguide can be of the non polarization-maintaining (PM) type.

FIGS. 4A and 4B show another example of a photonic chip 202, in accordance with another embodiment. Similarly to the photonic chip 102, the photonic chip 202 has a reflector unit 220 monolithically integrated to a top surface 206 of a substrate 204 of the photonic chip 202. In this embodiment, however, the reflector unit 220 is spaced from an edge 241 of the photonic chip 202 by a spacing distance d4.

The spacing distance d4 leaves room for a longitudinal trench 244 recessed in the substrate 204, through the top surface 206. As shown in this example, the longitudinal trench 244 is oriented parallel to the optical axis 222. As can be seen, the longitudinal trench 244 is sized and shaped to receive an end of an external optical waveguide. As shown, the external optical waveguide in this example is provided in the form of an optical fiber 238.

In this embodiment, the substrate 204 of the photonic chip 202 acts as a passive alignment bench for passively aligning the optical fiber 238 relative to the reflector unit 220. In other words, the longitudinal trench 244 of the substrate 204 acts as a passive alignment seat in which the optical fiber 238 can be seated for alignment relative to the reflector unit 220. As it will be understood, the longitudinal trench 244 can be designed to hold the optical fiber at an optimal coupling position in X-Y-Z, and in pitch/yaw axes of freedom. With conventional microfabrication processes, the longitudinal trench 244 can be machined with satisfactory tolerances. The remaining tolerances can be associated with the manufacturing of the optical fiber, namely the core-clad concentricity (<0.5 μm) and cladding diameter variation (125±0.7 μm). The cleave angle of the optical fiber 238 is also of relevance. For instance, in this example, the cleave angle is of 90° for optimal coupling. These are typical values for a singlemode fibers such as the SMF-28® from Corning®. It is considered that in this configuration, the optical fiber 238 and the vertical grating coupler 210 can be passively aligned relative to one another with insertion loss acceptable for the industry. The location and orientation of the reflector unit 220 are fixed relative to the region of interest of the photonic chip 202 and to the longitudinal trench 244. One advantage is that the longitudinal trench 244, the vertical grating coupler 210 and the reflector unit 220 are monolithically integrated to the photonic chip 202 and only the bare optical fiber 238 has to be approached and attached thereto for aligning the optical fiber 238 relative to the photonic chip 202.

The shape of the longitudinal trench 244 can vary from one embodiment to another. For instance, the longitudinal trench 244 has a rectangular prism shape in some embodiments whereas the longitudinal trench 244 has a V-groove shape in some other embodiments. The angle, depth and stop of the longitudinal trench 244 are designed to allow an optical fiber to be inserted and secured inside at the right position for optimal optical coupling without further alignment steps. By design, the longitudinal trench 244 is accurately positioned in the chip plane by using alignment marks and/or fiducials previously defined in lithography procedures during microfabrication of photonic chip features such as silicon waveguides and vertical grating couplers. The etch depth and angle of the longitudinal trench 244 can be controlled using chemical etching (e.g., anisotropic etching using well-known chemistry involving KOH and/or TMAH) and known etching rate in silicon crystal planes. This can ensure that the external optical waveguide, such as the optical fiber 238, once seated and abutted will be positioned precisely in XYZ, pitch and yaw. One alternative to the longitudinal trench 244 is a rectangular trench built by anisotropic etching such as deep reactive ion etching. Again, the position on chip is controlled by the lithography positioning accuracy and the depth by etching rate and/or in-situ measurement of depth etch.

Once the optical fiber 238 is set in the longitudinal trench 244 it can be permanently attached by using a top cover 246 made of a flat transparent glass with UV curable adhesive 248 inserted in between. Applying a compressive pressure between the substrate 204 and the top cover 246 during curing can minimize post-attachment shifts due to adhesive shrinkage. Other types of adhesives and attachment methods can be used if they allow the bottom part of the cylindrical external optical waveguide to be in contact with and abutted to the inner surfaces of the longitudinal trench 244. For instance, the external optical waveguide can be attached to the substrate 204 using soldering, welding, brazing and any other suitable types of attachment methods.

In alternate embodiments, both passive and active alignment techniques can be used concurrently. For instance, an additional cylindrical waveguide (not shown) with a size similar to the size of the optical fiber 238 can be spliced to the optical fiber 238 in order to modify its output mode field diameter. An example of a device that can be spliced is a GRIN optical element. The GRIN optical element can collimate a light beam or at least partially focus it in order to modify the light beam diameter and phase front profile. In the case where the shape of the GRIN optical element matches the size of the optical fiber 238, similar design of the longitudinal trench 244 can be made.

The reflector unit 220 shown in FIGS. 4A and 4B has a stiffness enhancement rib 250 set across the pocket 226. In this embodiment, the rib 250 is shown to run adjacent to a free edge of the pocket 226 at a position that does not disturb the reflection of the light. It is intended that the rib 250 can provide additional stiffness to the self-supporting pocket 226. More than one stiffness enhancement rib can be provided to the pocket 226 and different shapes (e.g., linear, arcuate, wavy, zigzag, hexagonal, honeycomb lattice) can be provided to the rib, depending on the embodiment. As best seen in FIG. 4B, the rib 250 is positioned to face towards the top surface 206 of the substrate 204. However, in some other embodiments, the rib 250 can be positioned to face away from the top surface 206.

It is contemplated that the optical fiber 238 can be any suitable type of optical fiber. For instance, in some embodiments, the optical fiber 238 is a singlemode optical fiber whereas the optical fiber 238 is a multimode optical fiber in some other embodiments. Other types of optical fiber may alternately be used depending on the embodiment.

Referring now to FIGS. 5A through 9B, a method of manufacturing a reflector unit on a photonic chip is described.

As shown in FIGS. 5A and 5B, the method includes a step of providing a substrate 304 having a top surface 306 with a region of interest 308. For instance, in this embodiment, the region of interest includes a vertical grating coupler. A first layer 352 of removable material is provided over the top surface 306 and covering the region of interest 308. The removable material can be a polymer material. Then, in this embodiment, the first layer 352 of removable material is compression shaped, e.g., using a master mold 354 having a negative predetermined bulge shape 356, to form a bulge 358 as shown in FIGS. 6A and 6B.

The first layer 352 of removable material can be dispensed using a spin coating process with varying thickness depending on viscosity and spinning speed. Another way of providing the first layer 352 is to deposit a thicker layer and to use a film casting technique such as doctor blade.

In some embodiments, the removable material is a UV cured material whereas in other embodiments the removable material is a polymer that cures with temperature, such as polyimide. Embossing using the latter technique can be referred to as hot embossing. Once cured, the bulge 358 can become the support for the following steps. One other means of fabrication of a bulge 358 in polymer material is to use a laser scanning process such as laser writing or a two-photon polymerization process. In addition to these two methods of fabrication, gray scale lithography can also be used. In this case the desired bulge shape is defined in a photoresist material which is on top of the polymer material. The photoresist shape can be transferred using an etching process such as reactive ion etching. Alternatively, a photodefinable polyimide can be directly used. Additional post processing of the bulge 358 can be made to provide better smoothness of the surface. For example, a heat treatment to reflow the polymer locally or at wafer scale can be performed.

Although FIGS. 5A through 9B show the fabrication of a single reflector unit 320, in practice, a plurality of reflector units can be fabricated on a plurality of photonic chips using wafer-scale microfabrication techniques such as imprinting or embossing. In some embodiments, more than one reflector unit can be manufactured on a single photonic chip. In these embodiments, one photonic chip can include an array of reflector units (e.g., 2, 4, 8, 16, 32, 64) wherein each reflector unit of the array has its corresponding chip waveguide as found in at least some optical communication applications. As shown in FIG. 10, bulges 358 can be provided onto the top surface 306 using known imprint technologies, such as the ones involving puddle dispense (see the left-hand side of FIG. 10) or droplet dispense (see the right-hand side of FIG. 10). As can be seen, more than one bulges 358 can be provided simultaneously on the top surface 306 of the photonic wafer. For instance, the master mold 354 can be fabricated on a substrate that can have dimensions similar to those of a photonic chip wafer. It can also be a single mold that can be placed at each desired region of interest of the photonic chip wafer. This master mold 354 can be made of a soft material or in a rigid substrate such as a silicon or metallic mold. This metallic mold can be manufactured using diamond turning techniques or be grown by electrodeposition directly from a polymer master. Then, this master mold can be used to print multiple wafers. The solid master can also be fabricated in a transparent substrate such as fused silica to allow UV light to pass through. With reference to the left-hand side of FIG. 10, it is noted that a residual layer 359 (e.g., having a thickness exceeding 50 μm) can remain on the top surface 306 and between the bulges 358 after the UV cure step. This residual layer 359 can be removed in a post-processing step (not shown). However, it will be understood that in some other embodiments, no residual layer 359 remains after the UV cure step, in which case such a post-processing step can be omitted.

Figure 7B:
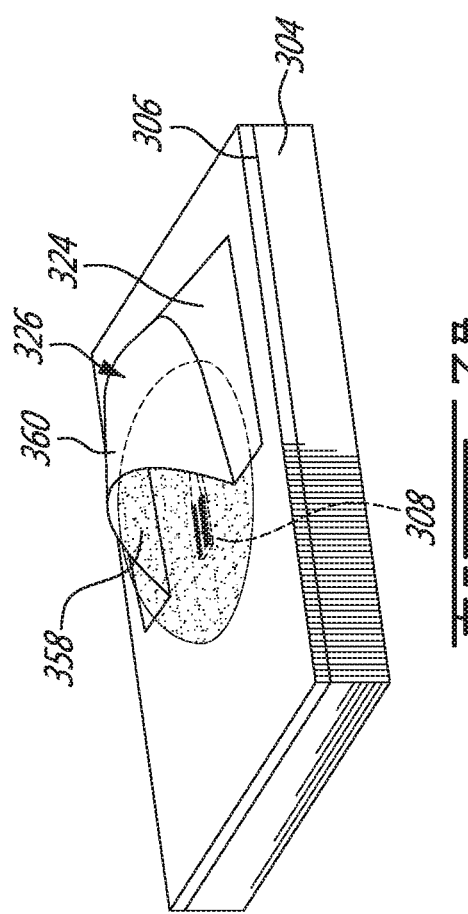
FIG. 7B is an oblique view of the photonic chip of FIG. 7A, in accordance with an embodiment.
Figure 7A:
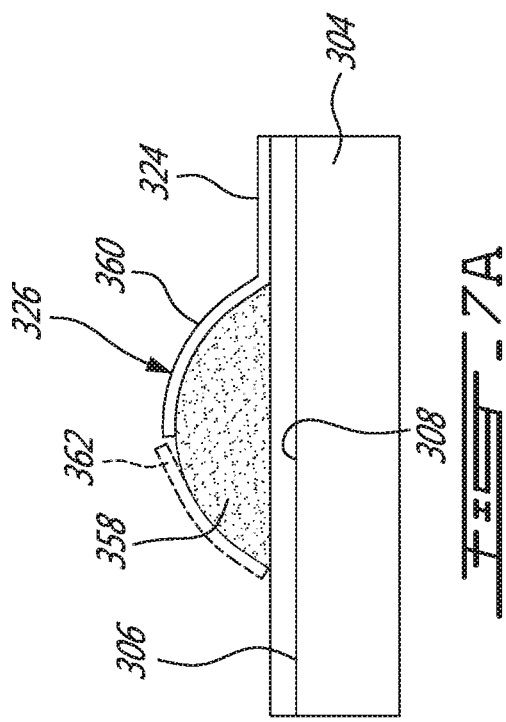
FIG. 7A is a sectional view of an example of a photonic chip in a third step of a method of manufacturing a reflector unit on a photonic chip, in accordance with an embodiment.

As depicted in FIGS. 7A and 7B, the method includes a step of monolithically integrating a second layer 360 of reflective material over a portion of the top surface 306 adjacent to the bulge 358 and over a portion of the bulge 358. In this step, the second layer 360 of reflective material forms a base 324 monolithically integrated to the portion of the top surface 306 and a pocket 326 monolithically integrated over the portion of the bulge 358 in a manner leaving a portion 362 of the bulge 358 uncovered.

In some embodiments, the reflective material is a metallic material such as aluminum or silver deposited by a vacuum process (evaporation, sputtering or any other suitable deposition processes). In some other embodiments, the reflective material can include a stack of dielectric layers.

The method can include a step of removing some portion of the second layer 360 of reflective material. For instance, the remaining portion of the second layer 360 of reflective material can be one half of the shape of the bulge 358 with the base 324 at the bottom for adhesion on the top surface 306 of the substrate 304. The geometry of the second layer 360 can be defined by photolithographic process combined with lift-off and/or etching step, well-known in the art.

Figure 8B:
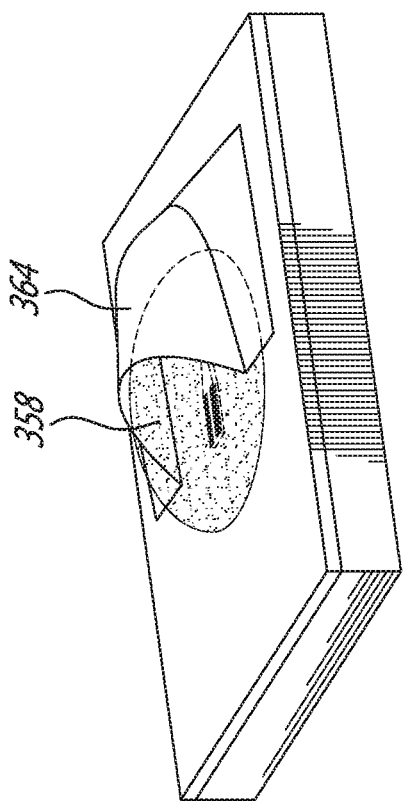
FIG. 8B is an oblique view of the photonic chip of FIG. 8A, in accordance with an embodiment.
Figure 8A:
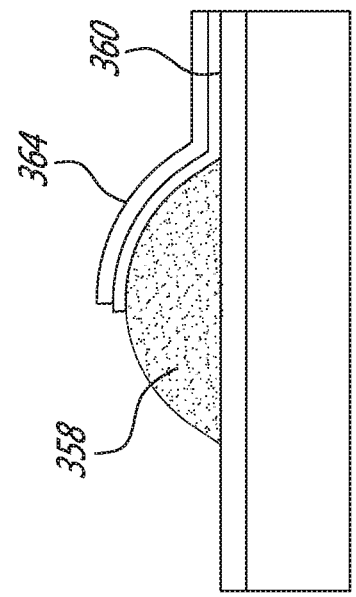
FIG. 8A is a sectional view of an example of a photonic chip in a fourth step of a method of manufacturing a reflector unit on a photonic chip, in accordance with an embodiment.

As illustrated in FIGS. 8A and 8B, the method includes a step of monolithically integrating a third layer 364 of dielectric material over the second layer 360, which can provide additional strength to the second layer 360 of reflective material.

Figure 9B:
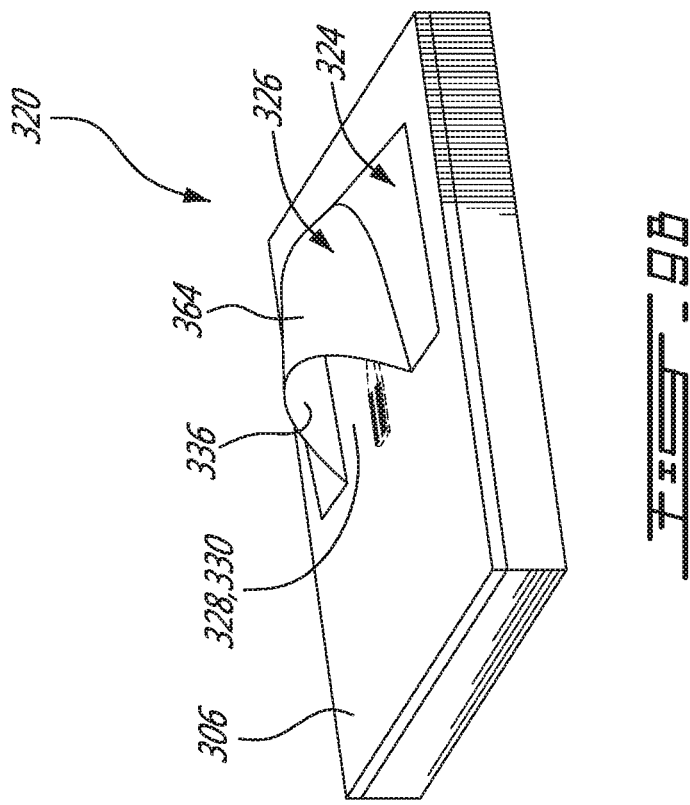
FIG. 9B is an oblique view of the photonic chip of FIG. 9A, in accordance with an embodiment.
Figure 9A:
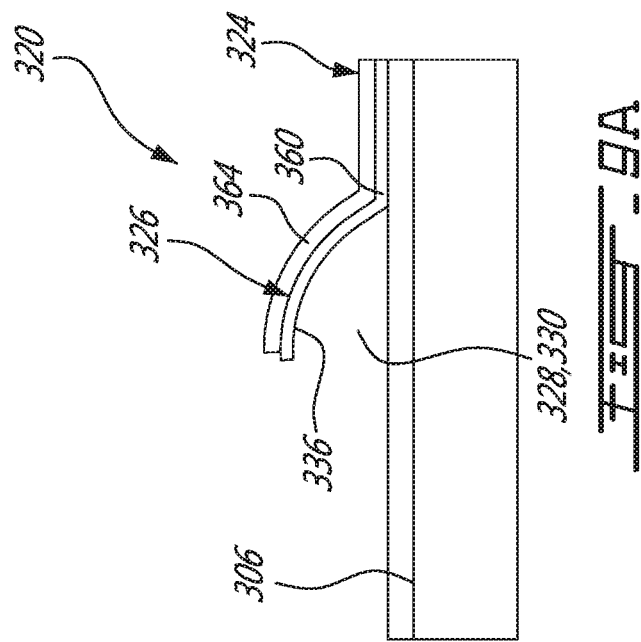
FIG. 9A is a sectional view of an example of a photonic chip in a fifth step of a method of manufacturing a reflector unit on a photonic chip, in accordance with an embodiment.
Figure 10:
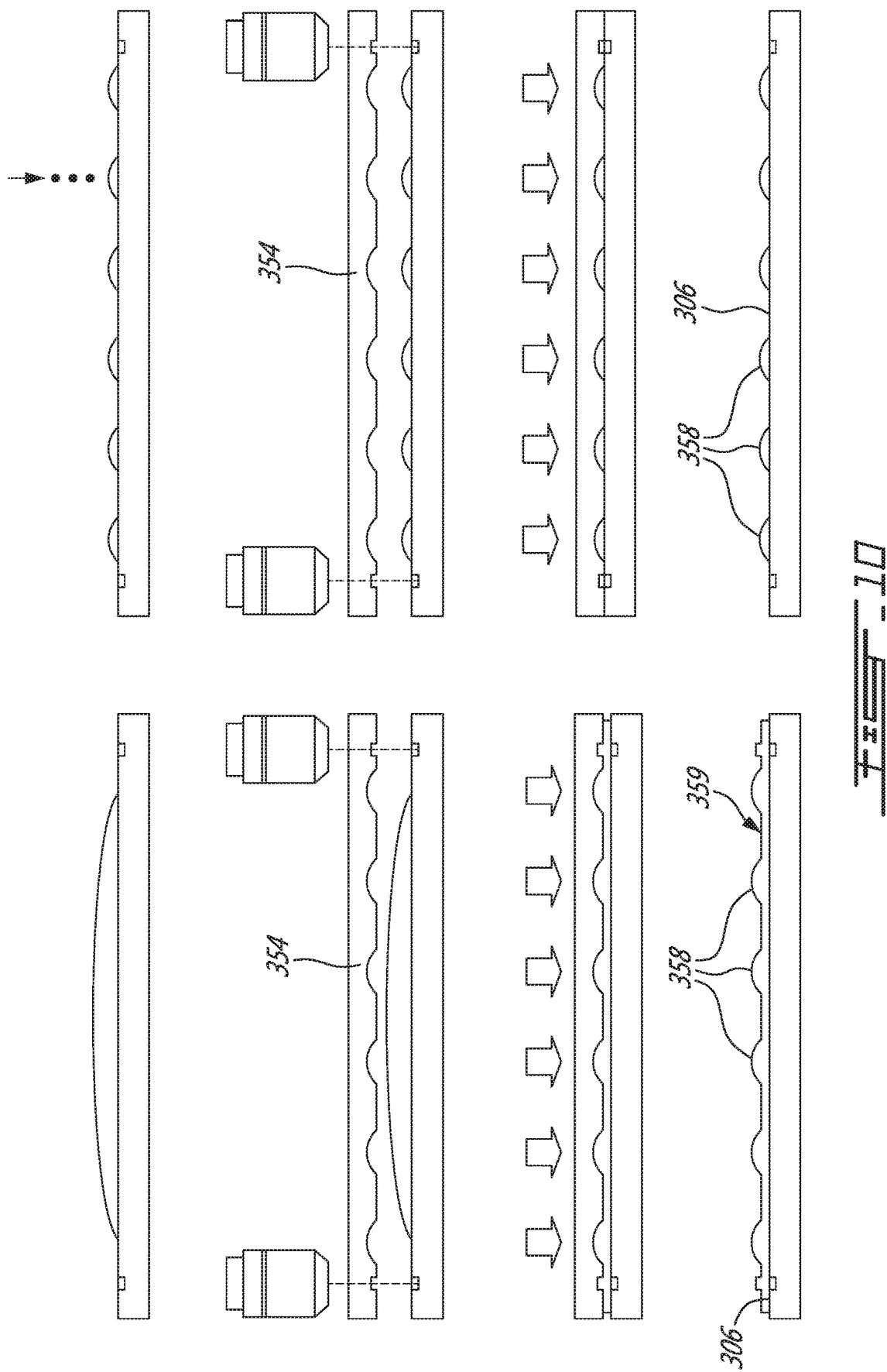
FIG. 10 includes side views (left-hand figure) of a photonic chip during a first bulge formation process and side views (right-hand figure) of a photonic chip during another, second bulge formation process, in accordance with some embodiments.
Figures 11A, 11B:
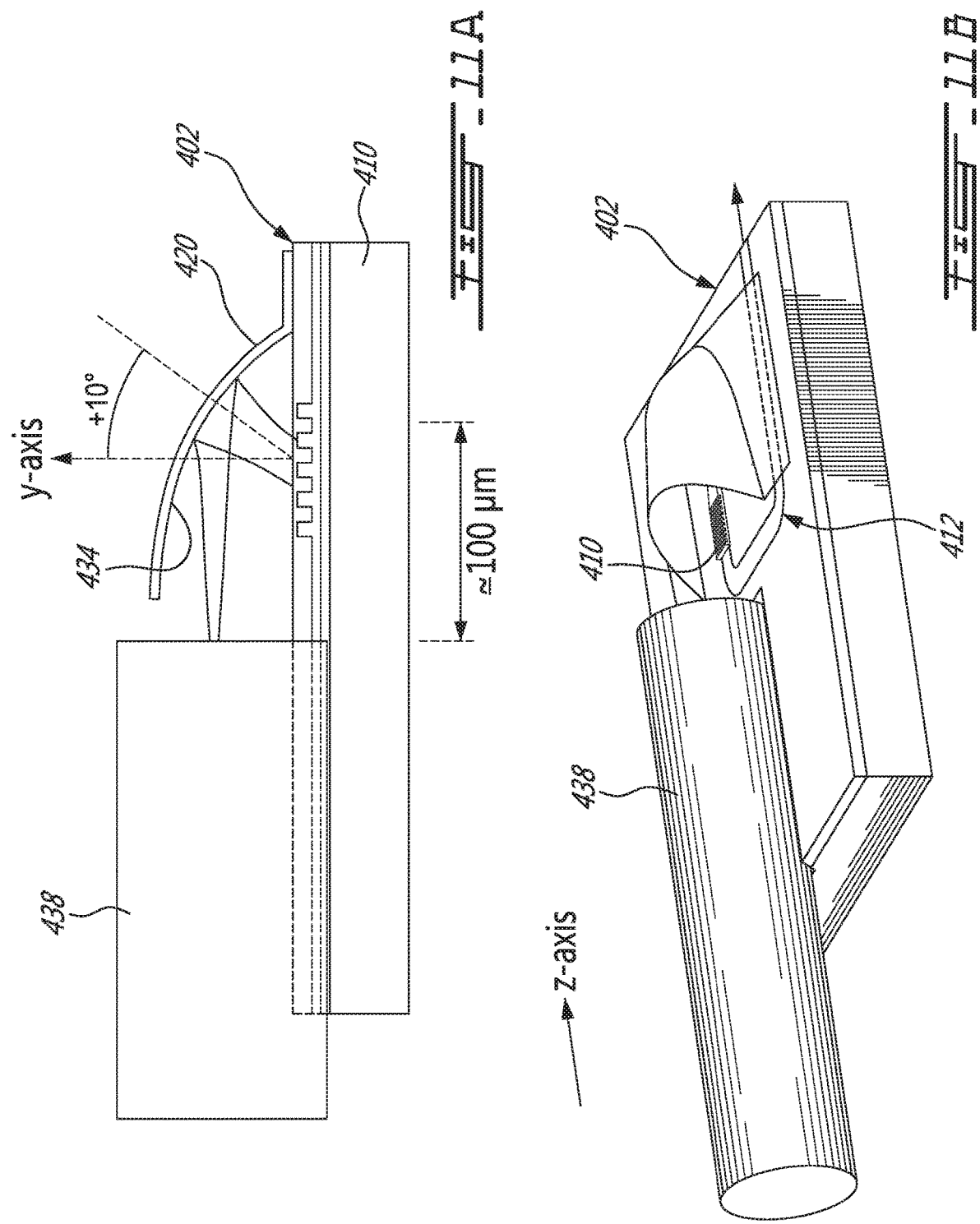
FIG. 11A is a sectional view of an example of a photonic chip having a reflector unit reflecting light at a first angle relative to a normal axis of the photonic chip, in accordance with an embodiment.
FIG. 11B is an oblique view of the photonic chip of FIG. 11A.

As shown in FIGS. 9A and 9B, the method includes a step of removing the bulge of the removable material. Once the bulge is removed, the second and third layers 360 and 364 collectively form the base 324 and the pocket 326. Because of its strength, the reflector unit 320 supports itself, thus allowing light to be reflected on the reflective material of its inner face 336. When the removable material is polyimide, it can be removed through dry etching processing such as plasma ashing. Any other suitable technique of removing the removable material can be used.

In alternate embodiments, the substrate 304 is obtained with the bulge 358 already covering the region of interest 308. In these embodiments, the step shown in FIGS. 5A and 5B can be omitted. Moreover, in further embodiments, the third layer 364 of dielectric material is omitted, leaving the resulting reflector unit with only one layer of reflective material.

In embodiments where a longitudinal trench is required for passive alignment purposes, the method can include a step of recessing the longitudinal trench in the top surface 306 of the substrate 304. The longitudinal trench can be recessed prior or after the fabrication of the reflector unit 320 onto the top surface 306 of the substrate 304. The sequence of the process steps depends on many parameters and must be chosen in order to avoid photoresist dispense topology issue. In some embodiments, the spray coating of photoresist may be employed to provide a conformal coating on three dimensional (3D) microstructures.

In some embodiments, the removable material can be left on the substrate to the cost of an additional interface which can cause some unwanted reflections. In these embodiments, the removable material is chosen so as to be an optically transparent material. In some other embodiments, the bulge can be made from an optically transparent material which is not necessarily removable. Also, the intrinsic material dispersion may cause chromatic aberrations that could affect the coupling efficiency at different wavelengths.

FIGS. 11A-B and FIGS. 12A-B respectively show two different examples of reflector units 420 and 520, in accordance with some embodiments. As depicted, the angle of the reflective surface can impact the path of the chip waveguide of the photonic chip. In the case of the reflector unit 420, the reflected light forms an angle of +10° with normal incidence such that the reflected light is directed back towards the external optical waveguide 438. In this embodiment, the vertical grating coupler 410 is optically coupled to a chip waveguide 412 which first runs towards the external optical waveguide 438 and which is then redirected towards the remainder of the photonic chip 402, for instance via one or more 5 μm bend radii. In the case of the reflector unit 520, the reflected light forms an angle of −10° with normal incidence such that the reflected light is directed straightforwardly towards the remainder of the photonic chip 502 and away from the external optical waveguide 538. In this embodiment, the chip waveguide 512 need not to have bend radii, such as shown in the embodiments of FIG. 2 and FIGS. 12A-B.

In some embodiments, the photonic chip is a silicon-on-insulator (SOI) wafer as commonly referred to in "silicon photonics" technologies. Silicon is a well-known material that can be patterned at the sub-micrometric scale. SOI wafers have been used in the manufacturing of integrated electronic circuits, and technological capabilities have been developed to allow for high miniaturization of electronic components. Parts of these technological capabilities have been used recently to fabricate photonic chips on SOI wafers, thus enabling new applications in various fields including high speed communications, optical sensing and biomedical. In these embodiments, the photonic chip has a body and a chip waveguide disposed on a top surface of the body of the photonic chip. The chip waveguide can be provided in the form of a silicon strip waveguide, a ridge, a rib, a slab and the like. In these embodiments, the body can include a substrate layer and an insulator layer disposed on the substrate layer. The substrate layer can be made of silicon (Si) and can have a thickness of several hundred micrometers while the insulator layer can be made of buried oxide (also referred to as "BOX") and can have a thickness in the range of about 0.5 to about 5 μm. The photonic chip can also include the cladding layer positioned atop the insulator layer. The cladding layer can be made of silicon dioxide ($SiO_2$) or silicon oxynitride ($SiO_xN_y$). One purpose of the cladding layer is to prevent the propagation of the light to be affected by what is disposed on top of the cladding layer. In some embodiments, the cladding layer can prevent the propagation of the light to be affected by the reflector unit monolithically disposed on top thereof. The composition of the various elements that form the photonic chip can vary from one embodiment to another. It will be understood by one skilled in the art that the reflector can also be monolithically integrated to other types of photonic chips originating from other types of wafers such as gallium arsenide (GaAs) wafers or Indium Phosphide (InP) wafers, for instance.

FIG. 13A shows an example of a photonic chip 602 having a reflector unit 620 monolithically integrated thereto, in accordance with another embodiment. As depicted, in this embodiment, a light source 670 is provided at the region of interest 608 instead of a vertical grating coupler. In this embodiment, the reflector unit 620 is adapted to receive light 622 from the light source 670 and to reflect the received light 622 towards the external optical waveguide 638. In this specific example, the light source 670 is provided in the form of a VCSEL 671. However, other types of embedded or deposited light source can be alternately used in other embodiments. For instance, examples of light sources can include VCSEL(s), laser diode(s), light-emitting diode(s) and/or any combination thereof.

FIG. 13B shows an example of a photonic chip 602 having a reflector unit 620 monolithically integrated thereto, in accordance with another embodiment. As depicted, in this embodiment, a light detector 670' is provided at the region of interest 608 instead of a light source. In this embodiment, the reflector unit 620 is adapted to receive light 622 from the external optical waveguide 638 and to reflect the received light towards the light detector 670'. In this specific example, the light detector 670' is provided in the form of a photodiode 671'. However, other examples of light detectors can alternatively be used. For instance, examples of light detectors can include photodiode(s), avalanche photodiode(s) and/or any combination thereof.

In another aspect, the reflector unit can be used as a base to build a hybrid laser source or to couple light to a semiconductor optical amplifier (SOA) on the photonic chip. Silicon is not a material that can easily emit light by the process of light amplification by stimulated emission of radiation (LASER). One way to have lasers on a silicon photonic chips is hybrid or heterogeneous integration where another lasing gain medium is integrated with the silicon photonic chip. For instance, the gain medium can be integrated into the silicon photonic chip in some embodiments whereas the gain medium can be disposed on a surface of the silicon photonic chip in some other embodiments. An example of such gain medium includes Indium Phosphide (InP). More specifically, InP is a semiconductor from the III-V family that emits light at wavelengths that can range from 1100 nm to 2000 nm, thus covering the optical communication band. The gain medium can be put on top of silicon photonic chips using integrated silicon photonics components for feedback and control. An example of heterogeneous integration is described in Komljenovic, Tin, et al. "Heterogeneous silicon photonic integrated circuits." Journal of Lightwave Technology 34.1 (2016): 20-35.

Figure 14:
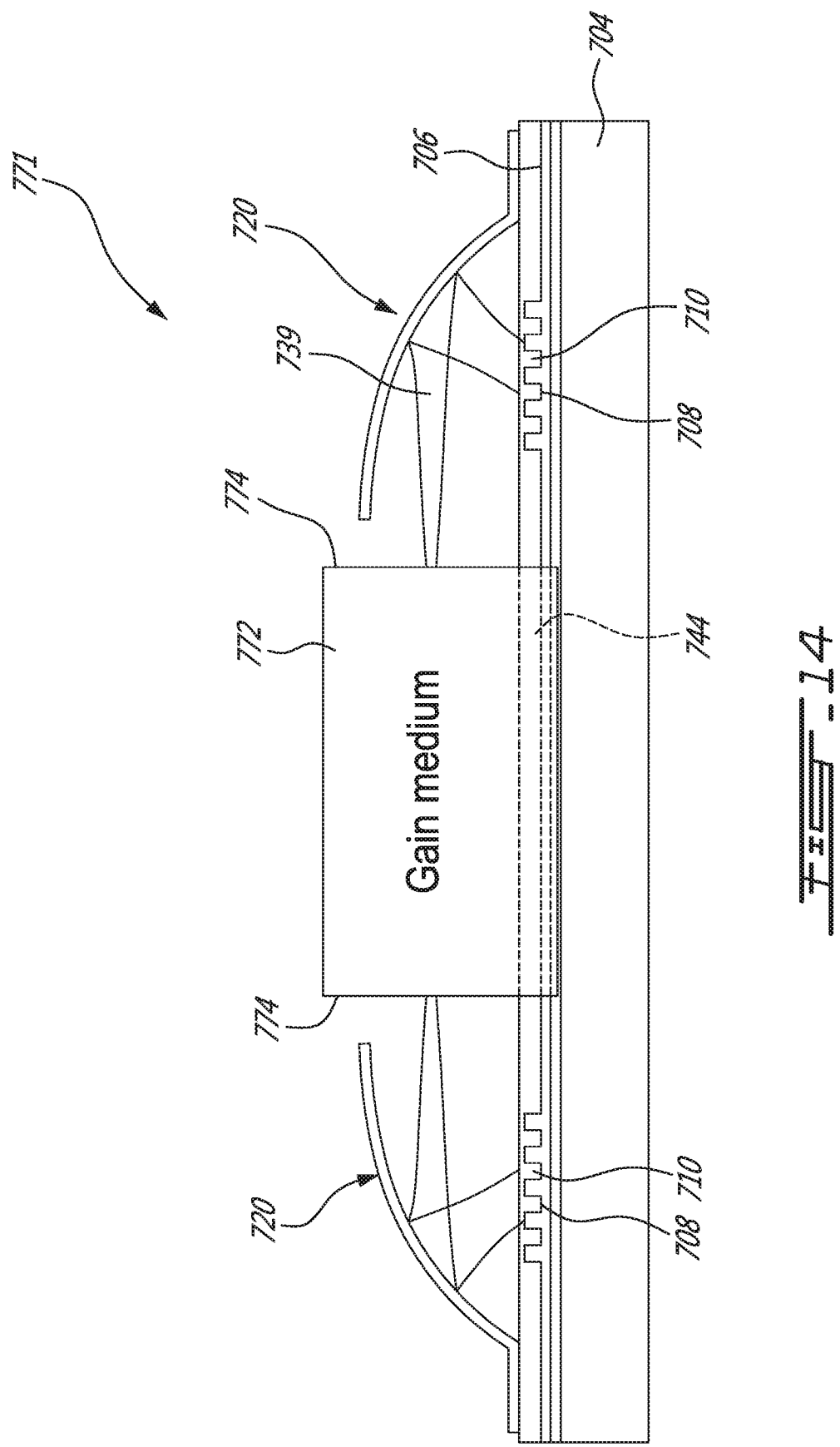
FIG. 14 is a sectional view of an example of a photonic chip having a piece of laser-active material disposed between two monolithically integrated reflector units facing each other, in accordance with an embodiment.

The gain medium of a laser needs to be in a cavity for the emission wavelength to resonate. As shown in the example of FIG. 14, there is shown a portion of a laser cavity 771 including a substrate 704, two reflector units 720 monolithically integrated to a top surface 706 of the substrate 704 and one or more pieces 772 ("the piece 772") of laser-active doped material fixed relative to the substrate 704 and in an optical path 739 extending between two regions of interest 708 via the two reflector units 720. As depicted in this embodiment, each of the two reflector units 720 faces a respective facet 774 of the piece 772 and the regions of interest 708 each include a vertical grating coupler 710. The two reflector units 720 are used to couple light between the vertical grating couplers 710 and through the piece 772 of laser-active material to create a laser cavity.

The laser-active material of the laser cavity 771 can be pumped in many ways. For instance, in this embodiment, the piece 772 includes a laser-active doped material which is optically pumpable with a pump signal incoming from either or both of the vertical coupling gratings 710. The laser-active doped material can be a rare earth material such as Erbium or Ytterbium and the like. The piece of laser-active material can be a given length of a doped optical fiber or a bulk piece of laser-active doped material. Indeed, the embodiment illustrated in FIG. 14 shows that the piece 772 is provided in the form of a relatively short length of doped optical fiber extending linearly between the two reflector units 720. However, it is intended that the piece 772 can be provided in the form of any length of doped optical fiber and that the piece 772 does not necessarily extend in a linear fashion between the two reflector units 720. For instance, the optical fiber can be positioned in a curved or rolled fashion on the top surface 706 of the substrate 704. As shown, the piece 772 is inserted in a trench 744 extending between the two reflector units 720.

Examples of embodiments where electrical pumping is needed include laser diode and/or semiconductor optical amplifier. These require two electrodes for electrical contacts. By design, in these embodiments, the trench allows electrical contact. For example the gain medium can have top and bottom surface electrodes, in which case the bottom of the trench becomes a contact. In alternate embodiments, the electrodes are both placed on the bottom surface of the gain medium and are connected to the surface of the trench via two distinct, spaced-apart electrical contacts. In further embodiments, the two electrode contacts can be on top of the gain medium. For instance, the piece 772 of laser-active semiconductor material can be wire bonded after assembly to allow electrical pumping.

FIG. 15 shows another example of a portion of a laser cavity 871, in accordance with an embodiment. As depicted, the laser cavity 871 includes a substrate 804, a single reflector unit 820 monolithically integrated to a top surface 806 of the substrate 804 and one or more pieces 872 ("the piece 872") of laser-active material fixed relative to the substrate 804. In this embodiment, the piece 872 is in an optical path 839 extending between a region of interest 808 and a distal facet 874*a* of the piece 872 via a reflection on the reflector unit 820 and propagation through the piece 872. In this case, the distal facet 874*a* includes a reflective coating 876, e.g., a partially reflective coating. However, in some other embodiments, a Bragg grating is inscribed at the distal facet 874*a* of the piece 872 to provide a satisfactory feedback for the laser cavity.

As can be understood, other laser components which are well-known in the art can be used with the laser cavities 771 and 871. A laser source incorporating such laser cavities can thus be provided with various designs and configurations depending on the application. Such laser components can be integrated on the substrate, be provided externally to the substrate, or a combination of both.

FIG. 16 shows another example of photonic chip 902, in accordance with an embodiment. As illustrated, the photonic chip 902 has a substrate 904 having a top surface 906 with a region of interest 908. A reflector unit 920 is provided on the top surface 906 of the substrate 904. More specifically, the reflector unit 920 has a base 924 which is monolithically integrated to the top surface 906 of the substrate 904 and a pocket 926 which extends upwardly from the base 924 and over a bulge 958 of optically transparent material. As shown in this example, the bulge 958 of optically transparent material has a receiving surface 978 which extends from the top surface 906 perpendicularly towards a free edge 980 of the pocket 926. In other words, the receiving surface 978 is molded to be flat in this example. Accordingly, the receiving surface 978 receives an optical axis 922 extending parallel to the top surface 906 and spaced apart from the top surface 906 so that light can be reflected to and from the region of interest 908 via the reflector unit 920, through the bulge 958 of optically transparent material. The shape of the reflector unit 920 can be adapted taking into account optical properties of the bulge 958 of optically transparent material. In this case, the bulge 958 can remain in the pocket 926. As it will be understood, in this case, the bulge 958 does not necessarily need to be removable, but it can be the case in some embodiments. Although the receiving surface 978 is shown to be flat in this example, the receiving surface 978 can also be curved in other embodiments. In the case of the optical transparent bulge 958 that will remain in the pocket 926, one of its end can be molded flat to be in front of the fiber optic waveguide. This can be required to improve the solidity of the reflector unit 920. In this case the shape of the reflector unit 920 is adapted accordingly taking into account optical properties of the material of the bulge 958.

In this embodiment, the manufacturing of the photonic chip 902 can include a step of providing the bulge 958, having a predetermined size and shape and including optically transparent material, onto the region of interest 908. Then, a layer 960 of metallic material is monolithically integrated onto a portion of the bulge 958 and onto a portion of the top surface 906 adjacent to the bulge 958. This leaves the base 924 monolithically integrated to the top surface 906 of the photonic chip 902 and the pocket 926 which extends upwardly from the base 924, over the bulge 958 of optically transparent material and towards the region of interest 908. An additional layer 964 of dielectric material can then be monolithically integrated over the layer 960, which can provide additional strength thereto. The inner face 936 of the pocket 926, being formed of metallic material, acts as a reflective surface for receiving light parallel to the top surface 906 and to reflect the received light towards the region of interest 908 or vice versa. It was found that the remaining bulge 958 can provide additional strength to the reflector unit 920 in these embodiments. Accordingly, in this embodiment, removing the bulge 958 is optional.

As it can be understood, the examples described above and illustrated are intended to be exemplary only. The pocket can have two vertical side walls extending from the base and a cover wall extending from the base and above distal edges of the two vertically-extending side walls. In some embodiments, the cover wall is planar. In some other embodiments, the cover wall is curved. The scope is indicated by the appended claims.

What is claimed is:

1. A method of manufacturing a reflector unit on a photonic chip, the method comprising:
providing a substrate having a top surface with a region of interest, the region of interest being covered with a bulge of a removable material;
monolithically integrating a layer of reflective material over a portion of the top surface adjacent to the bulge and over a portion of the bulge, the layer of reflective material forming a base monolithically integrated to the portion of the top surface and a pocket monolithically integrated over the portion of the bulge in a manner leaving a portion of the bulge uncovered;

removing the bulge of the removable material, the pocket having a lateral opening leaving a cavity between the pocket and the region of interest, the cavity receiving an optical axis extending parallel to the top surface, spaced apart from the top surface and through the opening, the layer of reflective material forming a reflector unit for reflecting light at least one of incoming from the region of interest and towards the region of interest; and recessing a longitudinal trench in the top surface of the substrate and parallel to the optical axis, the longitudinal trench being sized and shaped to receive an end of an external optical waveguide having a propagation axis coinciding with the optical axis.

2. The method of claim 1 further comprising monolithically integrating a layer of dielectric material over the layer of reflective material.

3. The method of claim 1 wherein said providing a substrate includes:
- providing a substrate having a top surface with a region of interest;
- providing a layer of removable material over the top surface covering the region of interest; and
- shaping the layer of removable material to form the bulge.

4. The method of claim 1 further comprising, prior to said step of monolithically integrating, engraving an indentation onto the bulge from one side of the bulge to another side of the bulge, wherein the layer of reflective material extends over the indentation and forms a stiffness enhancement rib across the pocket.

5. The method of claim 1 further comprising adhering the end of the external optical waveguide the longitudinal trench via an adhesive.

6. The method of claim 1 wherein the reflective material is provided in the form of a metallic material.

7. The method of claim 1 wherein said monolithically integrating includes monolithically integrating a layer of reflective material over the bulge and its surrounding and removing a portion of the layer of reflective material over the bulge in a manner to leave a portion of the bulge uncovered.

8. The method of claim 1 wherein said removable material is polyimide and wherein the bulge of removable material is removed using a dry etching process.

9. A method of manufacturing a reflector unit on a photonic chip, the method comprising:
- providing a substrate having a top surface with a region of interest, the region of interest being covered with a bulge of a removable material;
- engraving an indentation onto the bulge from one side of the bulge to another side of the bulge;
- monolithically integrating a layer of reflective material over a portion of the top surface adjacent to the bulge and over a portion of the bulge, the layer of reflective material forming a base monolithically integrated to the portion of the top surface and a pocket monolithically integrated over the portion of the bulge in a manner leaving a portion of the bulge uncovered, wherein the layer of reflective material extends over the indentation and forms a stiffness enhancement rib across the pocket; and
- removing the bulge of the removable material, the pocket having a lateral opening leaving a cavity between the pocket and the region of interest, the cavity receiving an optical axis extending parallel to the top surface, spaced apart from the top surface and through the opening, the layer of reflective material forming a reflector unit for reflecting light at least one of incoming from the region of interest and towards the region of interest.

10. The method of claim 9 further comprising monolithically integrating a layer of dielectric material over the layer of reflective material.

11. The method of claim 9 wherein said providing a substrate includes:
- providing a substrate having a top surface with a region of interest;
- providing a layer of removable material over the top surface covering the region of interest; and
- shaping the layer of removable material to form the bulge.

12. The method of claim 9 further comprising recessing a longitudinal trench in the top surface of the substrate and parallel to the optical axis, the longitudinal trench being sized and shaped to receive an end of an external optical waveguide having a propagation axis coinciding with the optical axis.

13. The method of claim 12 further comprising adhering the end of the external optical waveguide to the longitudinal trench via an adhesive.

14. The method of claim 9 wherein the reflective material is provided in the form of a metallic material.

15. The method of claim 9 wherein said monolithically integrating includes monolithically integrating a layer of reflective material over the bulge and its surrounding and removing a portion of the layer of reflective material over the bulge in a manner to leave a portion of the bulge uncovered.

16. The method of claim 9 wherein said removable material is polyimide and wherein the bulge of removable material is removed using a dry etching process.

* * * * *